US009012984B2

United States Patent
Cheng et al.

(10) Patent No.: US 9,012,984 B2
(45) Date of Patent: Apr. 21, 2015

(54) FIELD EFFECT TRANSISTOR DEVICES WITH REGROWN P-LAYERS

(71) Applicant: Cree, Inc., Durham, NC (US)

(72) Inventors: Lin Cheng, Chapel Hill, NC (US); Anant Agarwal, Chapel Hill, NC (US); John Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/798,919

(22) Filed: Mar. 13, 2013

(65) Prior Publication Data

US 2014/0264562 A1    Sep. 18, 2014

(51) Int. Cl.
*H01L 21/8242*    (2006.01)
*H01L 29/66*    (2006.01)
*H01L 29/78*    (2006.01)
*H01L 27/06*    (2006.01)
*H01L 29/739*    (2006.01)
*H01L 29/06*    (2006.01)
*H01L 29/16*    (2006.01)

(52) U.S. Cl.
CPC ...... *H01L 29/7827* (2013.01); *H01L 29/66666* (2013.01); *H01L 29/78* (2013.01); *H01L 29/66068* (2013.01); *H01L 29/7397* (2013.01); *H01L 29/0619* (2013.01); *H01L 29/1608* (2013.01)

(58) Field of Classification Search
CPC ..... H01L 21/00; H01L 29/00; H01L 29/7813; H01L 29/7825; H01L 29/781; H01L 29/4236; H01L 29/7816; H01L 2924/13091; H01L 29/66681

USPC ................................. 257/325–342
See application file for complete search history.

(56) References Cited

U.S. PATENT DOCUMENTS 5,821,600 A    10/1998 Chan
5,976,936 A *  11/1999 Miyajima et al. ............. 438/268

(Continued)

FOREIGN PATENT DOCUMENTS

JP    9-74191    3/1997
JP    2010-258386    11/2010
JP    2012-164707    8/2012

OTHER PUBLICATIONS

International Search Report and the Written Opinion of the International Searching Authority corresponding to International Application No. PCT/US2014/021759; Mailing Date: Jul. 7, 2014; 11 pages.

(Continued)

*Primary Examiner* — Marcos D. Pizarro
*Assistant Examiner* — Nelson Garces
(74) *Attorney, Agent, or Firm* — Myers Bigel Sibley & Sajovec, P.A.

(57) ABSTRACT

A transistor device includes a drift layer having a first conductivity type, a body layer on the drift layer, the body layer having a second conductivity type opposite the first conductivity type, and a source region on the body layer, the source region having the first conductivity type. The device further includes a trench extending through the source region and the body layer and into the drift layer, a channel layer on the inner sidewall of the trench, the channel layer having the second conductivity type and having an inner sidewall opposite an inner sidewall of the trench, a gate insulator on the inner sidewall of the channel layer, and a gate contact on the gate insulator.

9 Claims, 9 Drawing Sheets

(56) References Cited

U.S. PATENT DOCUMENTS

| | | | |
|---|---|---|---|
| 6,710,403 B2 | 3/2004 | Sapp | |
| 6,974,750 B2 | 12/2005 | Haase | |
| 7,183,229 B2 | 2/2007 | Yamanaka | |
| 7,843,004 B2 * | 11/2010 | Darwish | 257/341 |
| 2004/0099905 A1 | 5/2004 | Baliga | |
| 2004/0166637 A1 * | 8/2004 | Ito et al. | 438/270 |
| 2004/0241950 A1 | 12/2004 | Olofsson | |
| 2005/0082542 A1 | 4/2005 | Sumakeris et al. | |
| 2007/0029573 A1 | 2/2007 | Cheng et al. | |
| 2007/0262363 A1 * | 11/2007 | Tao et al. | 257/288 |
| 2008/0105949 A1 | 5/2008 | Zhang et al. | |
| 2008/0164520 A1 * | 7/2008 | Darwish | 257/334 |
| 2008/0258210 A1 * | 10/2008 | Venkatraman et al. | 257/330 |
| 2008/0268587 A1 | 10/2008 | Sadaka et al. | |
| 2009/0189228 A1 | 7/2009 | Zhang et al. | |
| 2009/0206924 A1 * | 8/2009 | Zeng et al. | 327/581 |
| 2010/0059814 A1 | 3/2010 | Loechelt et al. | |
| 2010/0207198 A1 | 8/2010 | Blanchard et al. | |
| 2011/0156054 A1 | 6/2011 | Takeuchi et al. | |
| 2011/0241111 A1 * | 10/2011 | Tamaki et al. | 257/342 |
| 2011/0254010 A1 | 10/2011 | Zhang | |
| 2011/0298044 A1 | 12/2011 | Yagi et al. | |
| 2012/0007142 A1 * | 1/2012 | Nagaoka et al. | 257/140 |
| 2012/0187421 A1 | 7/2012 | Cheng et al. | |
| 2012/0193643 A1 | 8/2012 | Masuda et al. | |
| 2012/0235164 A1 | 9/2012 | Zhang et al. | |
| 2012/0248462 A1 | 10/2012 | Wada et al. | |
| 2012/0305943 A1 | 12/2012 | Honaga et al. | |
| 2012/0313112 A1 | 12/2012 | Wada et al. | |
| 2014/0015036 A1 | 1/2014 | Fursin et al. | |

OTHER PUBLICATIONS

International Search Report and the Written Opinion of the International Searching Authority corresponding to International Application No. PCT/US2014/021737; Mailing Date: Jun. 20, 2014; 9 pages.

International Search Report and the Written Opinion of the International Searching Authority corresponding to International Application No. PCT/US2014/021781; Mailing Date: Jun. 26, 2014; 9 pages.

* cited by examiner

FIELD EFFECT TRANSISTOR DEVICES WITH REGROWN P-LAYERS

CROSS REFERENCE TO RELATED APPLICATION

The present application is related to U.S. application Ser. No. 13/799,049, entitled "FIELD EFFECT TRANSISTOR DEVICES WITH PROTECTIVE REGIONS,", U.S, application Ser. No. 13/799.142, entitled "FIELD EFFECT TRANSISTOR DEVICES WITH BURIED WELL PROTECTION REGIONS,", and U.S. application Ser. No. 13/799,316, entitled "FIELD EFFECT TRANSISTOR DEVICES WITH BURIED WELL REGIONS AND EPITAXIAL LAYERS,", all of which are filed concurrently herewith, The disclosures of each of the foregoing applications are incorporated herein by reference in their entirety.

FIELD OF THE INVENTION

The present invention relates to electronic devices and fabrication methods. More particularly, the present invention relates to high power insulated gate field effect and bipolar transistors and fabrication methods.

BACKGROUND

Power semiconductor devices are widely used to regulate large current, high voltage, and/or high frequency signals. Modern power electronic devices are generally fabricated from monocrystalline silicon semiconductor material. One widely used power device is the power Metal-Oxide Semiconductor (MOS) Field Effect Transistor (MOSFET). In a power MOSFET, a control signal is supplied to a gate electrode that is separated from the semiconductor surface by an intervening silicon dioxide insulator. Current conduction occurs via transport of majority carriers, without the presence of minority carrier injection that is used in bipolar transistor operation.

MOSFETs can be formed on a silicon carbide (SiC) layer. Silicon carbide (SiC) has a combination of electrical and physical properties that make it attractive as a semiconductor material for high temperature, high voltage, high frequency and/or high power electronic circuits. These properties include a 3.2 eV energy gap, about a 2.4 MV/cm electric breakdown field, a 4.9 W/cm-K thermal conductivity, and a 2.0×107 cm/s electron drift velocity.

Consequently, these properties may allow silicon carbide-based power electronic devices to operate at higher junction temperatures, higher power density levels, higher frequencies (e.g., radio, S band, X band), and/or with lower specific on-resistance and/or higher blocking voltages than silicon-based power electronic devices. A power MOSFET fabricated in silicon carbide is described in U.S. Pat. No. 5,506,421 to Palmour entitled "Power MOSFET in Silicon Carbide" and assigned to the assignee of the present invention.

Although silicon carbide itself is theoretically capable of sustaining high reverse voltages, it may be desirable to shield certain portions or features of a silicon carbide device, such as the gate insulator, the device edge, etc., from high electric fields, as breakdown may be more likely to occur at these locations.

SUMMARY

A transistor device according to some embodiments includes a drift layer having a first conductivity type, a body layer on the drift layer, the body layer having a second conductivity type opposite the first conductivity type, and a source region on the body layer, the source region having the first conductivity type. The device further includes a trench extending through the source region and the body layer and into the drift layer, the trench having an inner sidewall, a channel layer on the inner sidewall of the trench, the channel layer having the second conductivity type and having an inner sidewall opposite the inner sidewall of the trench, a gate insulator on the inner sidewall of the channel layer, and a gate contact on the gate insulator.

The channel layer has an upper surface, and the gate insulator may be on the upper surface of the channel layer. The gate contact may extend on to the gate insulator above the upper surface of the channel layer.

The gate insulator may extend onto the source region adjacent the channel layer, and the gate contact may extend onto the gate insulator above the source region.

The transistor may further include a body contact region having the second conductivity type. The body contact region may be adjacent to and spaced apart from the trench and may extend through the source region and into the body layer.

The body contact region may extend into the drift layer.

The trench may extend about 0.1 micron to about 1 micron into the drift layer.

The channel layer may have a thickness of about 20 nm to 2000 nm, and in some embodiments from about 30 nm to 1000 nm.

The gate insulator may extend into the trench adjacent a sidewall of the drift layer exposed by the trench beneath the channel layer.

A transistor device according to further embodiments includes a body region having a first surface, source and drain regions on opposite sides of the body region, and a channel layer on the first surface of the body region. The channel layer extends onto the source and drain regions. The body region and the channel region have a first conductivity type and the source and drain regions have a second conductivity type that is opposite the first conductivity type.

The transistor device may further include a gate insulator on the channel layer and a gate contact on the gate insulator. The gate contact may be spaced apart from the source and drain regions by the gate insulator.

A method of fabricating a transistor according to some embodiments includes providing a semiconductor structure including a drift layer having a first conductivity type and a body layer having a second conductivity type opposite the first conductivity type on the drift layer, forming a source layer on the body layer, forming a trench in the structure, the trench extending through the source layer and the body layer and having a sidewall and a floor, forming a semiconductor layer having the second conductivity type on the source layer and on the sidewall and floor of the trench, anisotropically etching the semiconductor layer to remove the semiconductor layer from the source layer and from the floor of the trench to thereby form a channel layer on the sidewall of the trench adjacent the source layer and the body layer, forming a gate insulator on the channel layer, and forming a gate contact on the gate insulator.

The method may further include etching the trench into the drift layer after forming the channel layer.

Etching the trench may include etching about 0.1 micron to about 2 micron into the drift layer.

Forming the gate insulator may include forming the gate insulator to extend onto a top surface of the channel layer opposite the substrate, and forming the gate contact may include forming the gate contact to extend onto the gate insulator above the top surface of the channel layer.

The semiconductor layer may be formed by epitaxial regrowth, and may be grown to a thickness of about 20 nm to about 2000 nm, and in some embodiments from about 30 nm to about 1000 nm.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Some embodiments of the invention provide silicon carbide (SiC) insulated gate devices that are suitable for high power and/or high temperature applications.

Embodiments of the present invention provide trench UMOS structures that include epitaxially regrown channel layers on the sidewalls of the trench, wherein the channel layers have the same conductivity type as the body layers. For example, an n-channel UMOS device according to some embodiments may include a p-type epitaxial channel layer on a sidewall of the UMOS trench. The epitaxially regrown channel layers may improve MOS interface quality, and hence inversion channel mobility as well as maintain a desired threshold voltage by adjusting the total charge of the channel layer.

Conventional n-channel vertical-trench MOSFET structures typically include a p-type trench sidewall that is formed by a selective plasma dry etch. However, due to the damage caused to the trench sidewalls by the plasma dry-etch process, the crystal structure of the etched surface may be very poor, which can degrade MOS interface quality, and hence the inversion channel mobility, and lead to poor MOS channel conductivity and/or undesired transfer characteristics.

A conventional approach to overcome this problem in an n-channel device is to form a thin, lightly doped n-type channel layer by epitaxial regrowth on a vertical sidewall of the trench. The n-type channel layer acts as an accumulation layer and provides a current path that connects the n-type source and drain regions of the device. As a result, forward conduction of the device may be greatly improved. However, providing an n-type channel layer on a p-type body region may lower the threshold voltage of the device, which affects the off-state blocking capability and reliability of the device, especially at high temperatures.

In contrast, embodiments of the present invention provide an epitaxial channel layer on a sidewall of a UMOS trench that has the opposite conductivity type from the source/drain regions (i.e. for an n-channel device, the epitaxial channel layer is p-type). The gate insulator and gate are arranged so that both horizontal and vertical inversion layers are formed in the epitaxial channel layer upon application of a gate voltage, which provides a current path between the source and drain regions of the device during forward operation.

Figure 1:
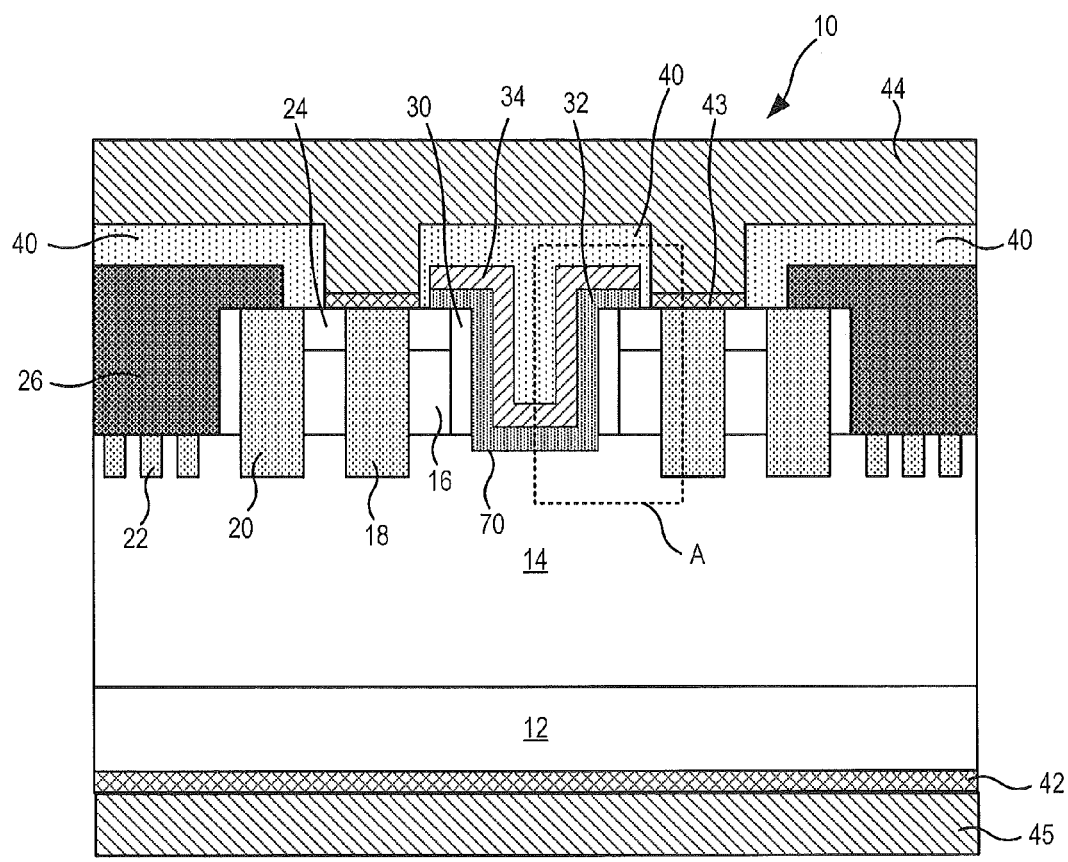
FIG. 1 is a cross sectional illustration of a cell of a power MOSFET device according to some embodiments.

A unit cell 10 of a MOSFET structure according to some embodiments is shown in FIG. 1. A detailed close-up view of a portion of the device 10 including the epitaxial channel layer 30 is shown in FIG. 2.

Figure 2:
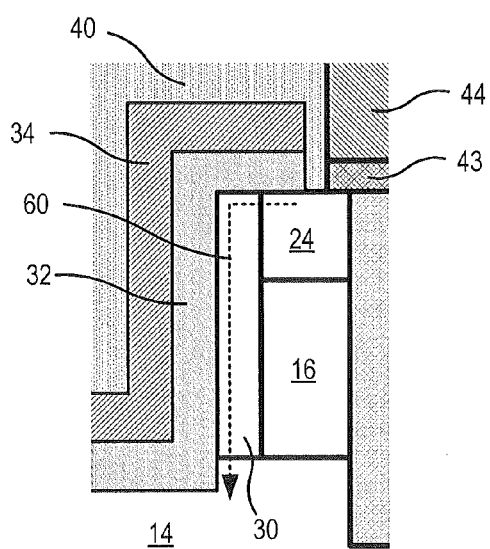
FIG. 2 is a detail view of a portion of the power MOSFET cell shown in FIG. 1.

Referring to FIGS. 1 and 2, the device 10 includes an epitaxial drift layer 14 having a first conductivity type on a substrate 12. The substrate 12 may be a 2° to 8° off-axis 4H—SiC substrate, although other substrates and/or substrate materials may be used. The epitaxial layers may be silicon carbide or other semiconductor materials. For silicon carbide devices, the drift layer 14 may have a thickness of about 5 μm to about 200 μm, and may be doped with n-type dopants at a doping concentration of about $5 \times 10^{13}$ cm$^{-3}$ to about $2 \times 10^{16}$ cm$^{-3}$. Other doping concentrations/voltage blocking ranges are also possible.

The structure further includes a second conductivity type body region 16 and a first conductivity type source region 24 that may be formed by selective implantation of opposite conductivity type dopants, respectively, into the drift layer 14. Alternatively, one or both of the body region 16 and the source region 24 may be formed by epitaxial growth on the drift layer 14. The source region 24 has the same conductivity type as the drift layer (i.e., the first conductivity type), while the body region 16 has the second conductivity type.

A trench 70 extends through the source region 24 and the body region 16 and into the drift layer 14. A channel layer 30 is formed on a sidewall of the trench 70. The channel layer 30 may have the second conductivity type. That is, when the body region 16 is p-type, the channel layer 30 may also be p-type. The channel layer 30 may be formed by epitaxial regrowth, which may allow the channel layer 30 to have a high crystal quality and/or a tightly controlled doping level.

The structure 10 further includes first body contact regions 18 that extend through the source region 24 and the body region 16 and into the drift layer 14. The body contact regions 18 have the second conductivity type. The first body contact regions 18 extend into the drift layer 14 near a lower corner of the trench 70 and may protect the lower corner of the trench 70 from high electric fields when the device is in a reverse blocking state in addition to providing an electrical connection between the source contact 44 and the body region 16.

Source ohmic contacts 43 are formed on exposed portions of the first body contact regions 18 as well as the source region 24. The source ohmic contacts 43 may include, for example, Ni, Al, Ti, Si, etc.

A gate insulator 32 is formed on sidewall surfaces and bottom surfaces of the trench 70. The gate insulator 32 may, for example, be silicon oxide or silicon nitric oxide, or a stack including both. Referring to FIG. 2, the gate insulator 32 may extend up over the channel layer 30 and onto the source region 24.

A gate electrode 34 is on the gate insulator 32. The gate electrode 34 may, for example, include doped polysilicon.

The gate electrode 34 may also extend up over the channel layer 30 and onto the source region 24.

Referring again to FIG. 1, a field oxide 26 may be formed around the active region of the device 10. An interlayer insulation layer 40 is on the entire structure and exposes the ohmic contacts 43, and a source overlayer 44 is on the interlayer insulation layer 40 and in contact with the ohmic contacts 43. A drain ohmic contact 42 is on the back side of the substrate 12, and a drain overlayer 45 is on the drain ohmic contact 42.

A junction termination 22 including, for example, floating field rings and/or junction termination extension (JTE), may be provided around the device periphery. Other types of termination structures may be used. Implanted regions 20 may include unetched portions of the junction termination 22.

Referring again to FIG. 2, when a sufficient voltage is applied to the gate electrode 34, an inversion channel is formed at both a side surface and an upper surface of the channel layer 30, allowing charge carriers to flow from the source region 24 through the channel layer 30 and to the drift layer 14 along the path 60. Forming the channel layer to have the same conductivity type as the body region 16 may provide a flexibility to adjust the charge of the channel layer for a desired threshold voltage and/or transconductance by controlling the doping or thickness, or both, of the channel layer. This can significantly decrease reverse leakage current and/or power loss in the device during off- or transient states.

The channel layer 30 formed on the sidewall of the trench 30 may provide a SiC layer with a high crystal quality, which may improve the quality of the MOS interface between the channel layer 30 and the gate insulator 32. This may improve the inversion channel mobility, and may also maintain the threshold voltage high enough for robust off-state performance as well as improving long term reliability and high temperature stability.

FIGS. 3A to 3I are cross sectional views illustrating the fabrication of a power MOSFET device according to some embodiments.

Figure 3A:
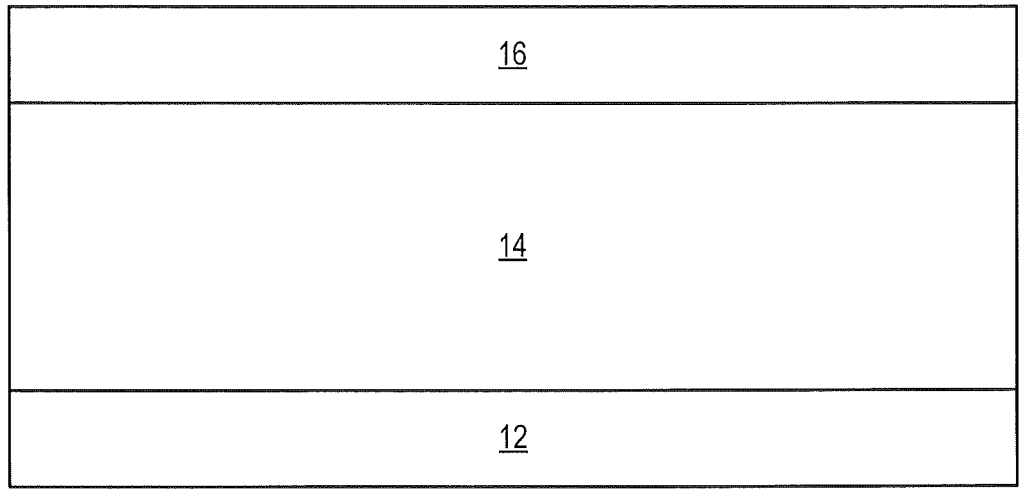
FIGS. 3A to 3I are cross sectional views illustrating the fabrication of a power MOSFET device according to some embodiments.

Referring to FIG. 3A, a substrate 12 is provided. The substrate 12 may be an off-axis SiC substrate having the 2H, 4H, 6H, 3C or 15R polytype. In particular embodiments, the substrate 12 may be an n+ off-axis 4H SiC substrate.

A drift layer 14 is formed on the substrate 12 and a body region 16 is formed on the drift layer 14. The drift layer 14 may have a thickness of about 5 μm to 200 μm, and may be doped with n-type dopants at a doping concentration of about $5\times10^{13}$ cm$^{-3}$ to about $2\times10^{16}$ cm$^{-3}$. Other doping concentrations/voltage blocking ranges are also possible. In particular embodiments, the substrate 12 may include a 2° to 8° off-axis 4H—SiC substrate and the drift layer 14 may have a thickness of about 6 to 15 μm and may be doped with dopants at a doping concentration of about $5\times10^{15}$ cm$^{-3}$ to about $1.2\times10^{16}$ cm$^{-3}$.

The body region 16 may be doped with p-type dopants at a doping concentration of about $1\times10^{16}$ cm$^{-3}$ to about $5\times10^{18}$ cm$^{3}$, and may have a thickness of about 0.5 μm to about 2 μm. The body region 16 may be formed by ion implantation and/or epitaxial growth.

Figure 3B:
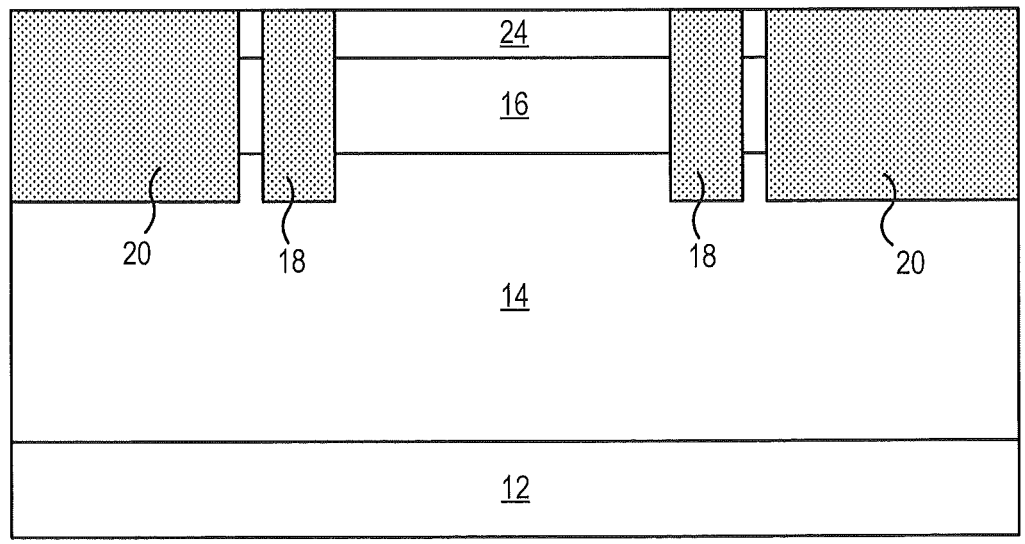

Referring to FIG. 3B, a source region 24 is formed on the body region 16. The source region 24 may be doped with n-type dopants at a doping concentration of about $1\times10^{18}$ cm$^{-3}$ to about $5\times10^{20}$ cm$^{-3}$, and may have a thickness of about 0.2 μm to about 1 μm. The source region 24 may be formed by ion implantation and/or epitaxial growth. The doping profile in the source region 24 may be uniform in some embodiments. In other embodiments, the doping profile in the source region 24 may have a gradient and/or a delta doping profile.

The body contact regions 18 and inner edge of the termination region 20 are formed by ion implantation into the structure on a side of the epitaxial region opposite the substrate 12. The body contact regions 18 and inner edge of the termination region 20 may be formed to extend through the source region 24, the body region 16 and into the drift layer 14. The body contact regions 18 may be formed using a multiple implant profile including implants having a dose of $1\times10^{14}$ cm$^{-2}$ to $1\times10^{16}$ cm$^{-2}$ and an implant energy of from 10 to 1000 keV, resulting in a doping concentration of about $1\times10^{18}$ to about $5\times10^{20}$ cm$^{-3}$. The first body contact region 18 may have a width of about 0.5 to 5 μm, and in some embodiments from about 1 to 3 μm.

Figure 3C:
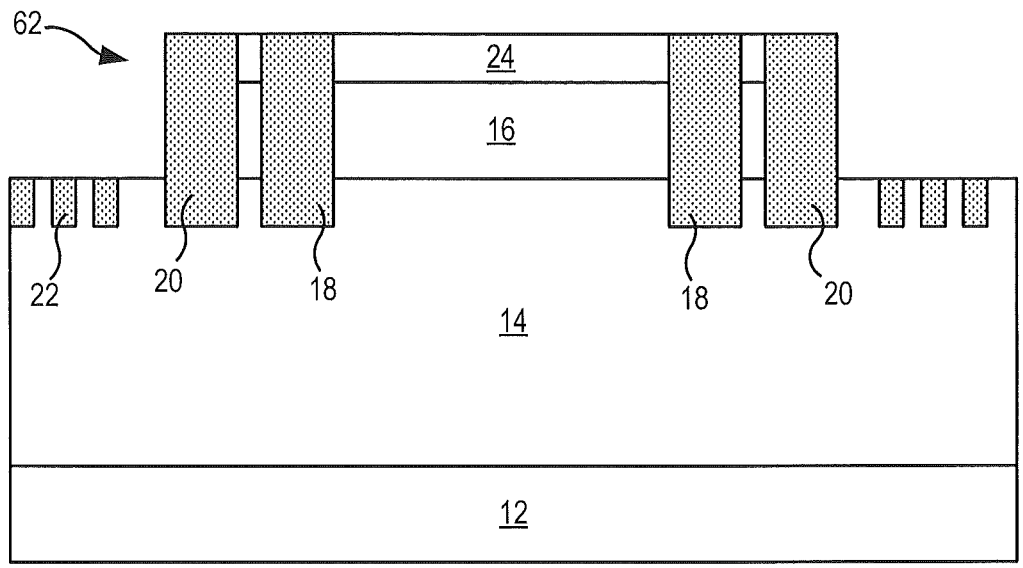

Referring to FIG. 3C, peripheral portions of the structure may be etched down to the drift layer 14 to form a mesa 62 including the body region 16, the source region 24 and the inner edge of the termination region 22. Exposed portions of the drift layer 14 may be selectively implanted with p-type dopants to form a complete edge termination region 22 including floating guard rings and/or junction termination extension region that help balance the charges in the termination area for the device. Other types of edge terminations, such as junction termination extensions, field plates, etc., may be used in addition to or instead of the guard ring termination shown.

All of the implanted dopants may be activated by annealing the structure at a temperature of about 1500° C. to 1800° C. with silicon over pressure and/or covered by an encapsulation layer such as a graphite film. A high temperature anneal may degrade the surface crystalline and/or Si/C atomic ratio of the silicon carbide epitaxy without these conditions. The silicon overpressure may be provided by the presence of silane, or the close proximity of silicon carbide coated objects that provide a certain amount of silicon overpressure. Alternatively or in combination with silicon overpressure, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional photoresist coating method and may have a thickness of about 0.5 to 10 μm. The graphite coating may be heated to form a crystalline coating on the drift layer 14. The implanted ions may be activated by a thermal anneal that may be performed, for example, in an inert gas at a temperature of about 1500° C. or greater. In particular the thermal anneal may be performed at a temperature of about 1650° C. in argon for 30 minutes. The graphite coating may help to protect the exposed surfaces of the drift layer 14, source regions 24, body contact regions 18 and termination region 22 during the high temperature implant activation anneal.

The graphite coating may then be removed, for example, by ashing and/or thermal oxidation.

Figure 3D:
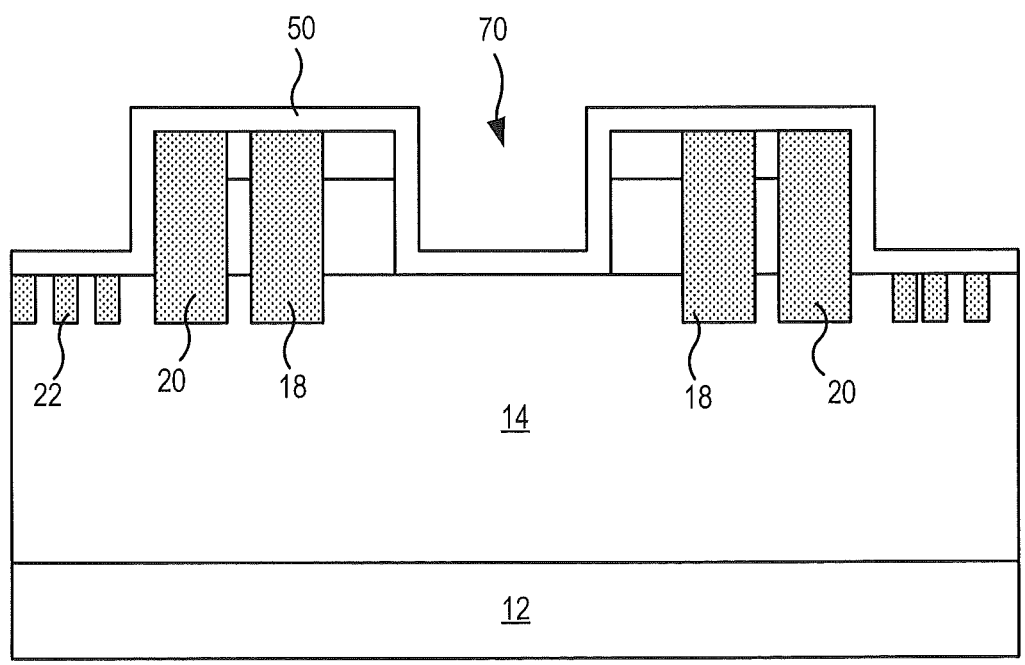

Referring to FIG. 3D, a trench 70 is formed in the structure between the body contact regions 18. The trench 70 extends through the source layer 24 and the body or well layer 16 to the drift layer 14. Next, an epitaxial layer 50 is regrown on the structure including inner sidewalls of the trench 70.

The epitaxial layer 50 is doped to have the same conductivity type as the body or well layer 16 and may have a thickness of about 20 nm to about 2000 nm, and in some embodiments from 30 nm to 1000 nm. In other embodiments, the epitaxial layer 50 may be as thick as 5000 nm. In particular embodiments, the epitaxial layer 50 is doped with p-type dopants at a doping concentration of $5\times10^{17}$ cm$^{-3}$ to $5\times10^{18}$ cm$^{-3}$, and has a thickness of about 200 nm.

Figure 3E:
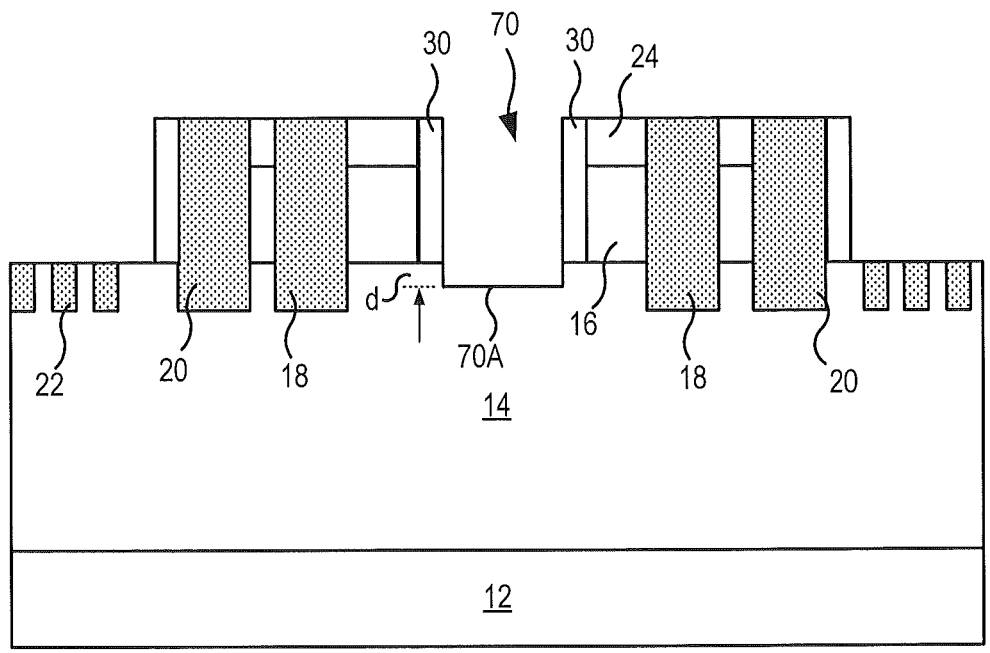

Referring to FIG. 3E, the epitaxial layer 50 is anisotropically etched using a plasma dry-etch process such as a reactive ion etch (RIE) using a fluorine chemistry. The anisotropic etch is performed to remove the epitaxial layer 50 from the source layer 24 and from the exposed portions of the drift layer 14 at the bottom of the trench 70, leaving channel layers 30 on the inner sidewalls of the trench 70.

In addition, the anisotropic etch (or a subsequent etch) may also lower the floor 70A of the trench 70 to distance d that is about 0.1 μm to 2 μm below bottom surfaces of the channel layers 30. In particular embodiments, the distance d may be from about 0.2 to 1 μm. Over-etching the trench floor may allow formation of a current path from the channel layer 30 to the drift layer 14. However, overetching too much can reduce the blocking voltage of the device.

Figure 3F:
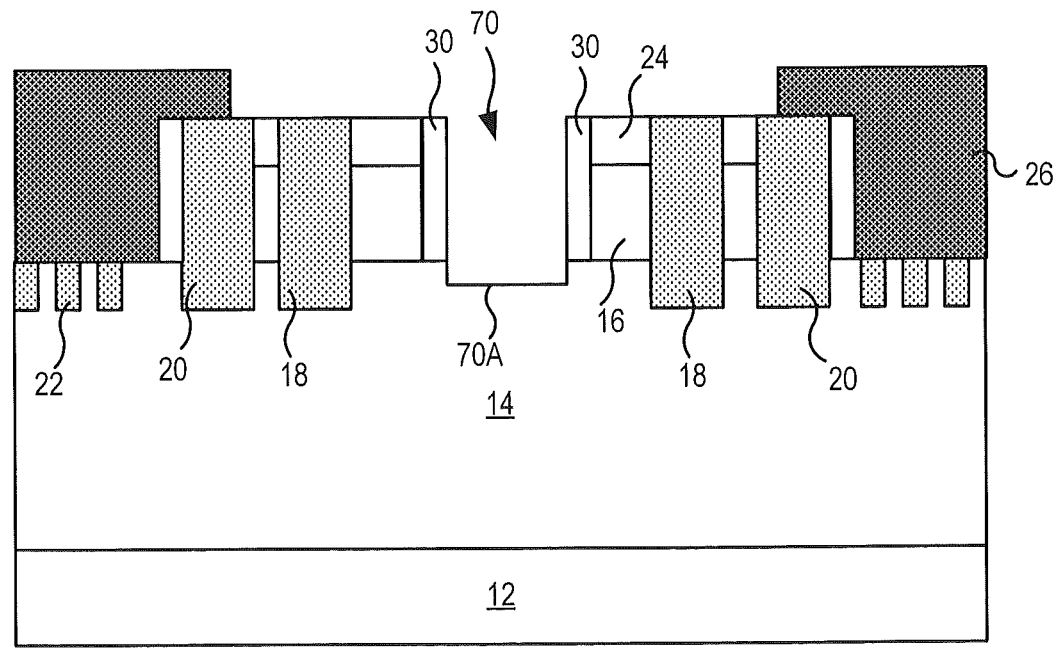

Referring to FIG. 3F, a field oxide 26 of, for example, silicon dioxide having a thickness of about 0.5 μm to 10 μm may be deposited and patterned to expose the active region of the device for external electrical connections.

Figure 3G:
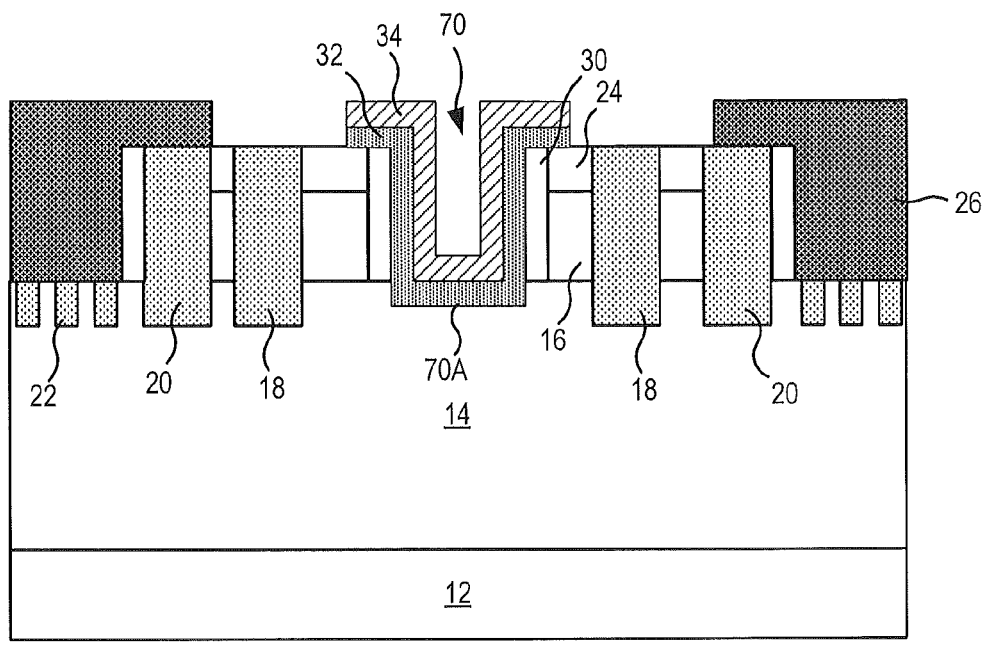

Referring to FIG. 3G, a gate insulator 32 may be formed in the trench 70 by a gate oxidation process, with a final gate oxide thickness of 20 nm-200 nm.

In particular, the gate insulator 32 may be formed using an annealed high temperature or a PECVD silicon-oxide deposition process.

In some embodiments, an oxide layer may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1250° C. in dry $O_2$ for a time of at least about 0.5 to 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 1 to 5 hours. The resulting oxide layer may be annealed at a temperature of up to about 1250° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the $SiC/SiO_2$ interface, which may introduce additional interface states. In particular, the wet $O_2$ anneal may be performed in wet $O_2$ at a temperature of about 950° C. for about 1 to 3 hours. The resulting gate oxide layer may have a thickness of about 30 nm to 100 nm.

In some embodiments, the dry $O_2$ oxide growth may be performed at a temperature of about 1175° C. in dry $O_2$ for about 0.5 to 2 hours. The resulting oxide layer may be annealed at a temperature of up to about 1175° C. in an inert atmosphere. In particular, the resulting oxide layer may be annealed at a temperature of about 1175° C. in Ar for about a time duration ranging from 30 min to 6 hours. Then the oxide layer receives an anneal in NO and/or $N_2O$ ambient at a temperature ranging from 1000° C. to 1300° C., for a duration ranging from 30 minutes to 6 hours. The resulting gate oxide layer may have a thickness of about 30 nm to 200 nm.

After formation of the gate insulator 32, a polysilicon gate 34 may be deposited and doped, for example, with boron followed by a metallization process to reduce the gate resistance. The gate insulator 32 and the gate 34 may be patterned using photolithography so that the gate insulator 32 and the gate 34 extend up over top surfaces of the channel layers 30 and onto the source regions 24.

Figure 3H:
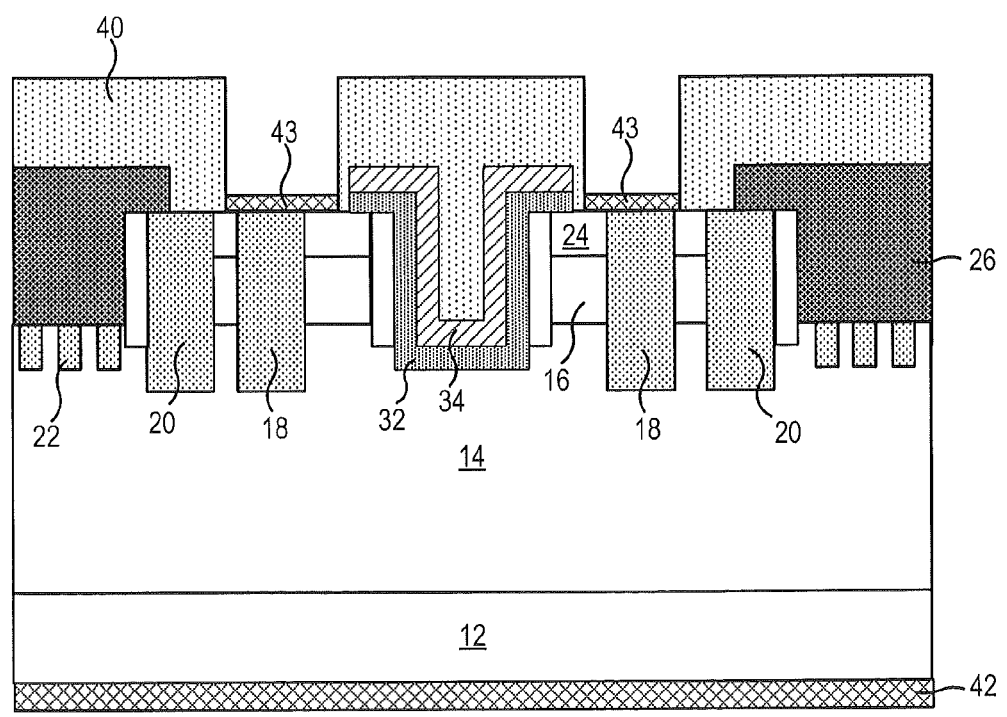
Figure 3I:
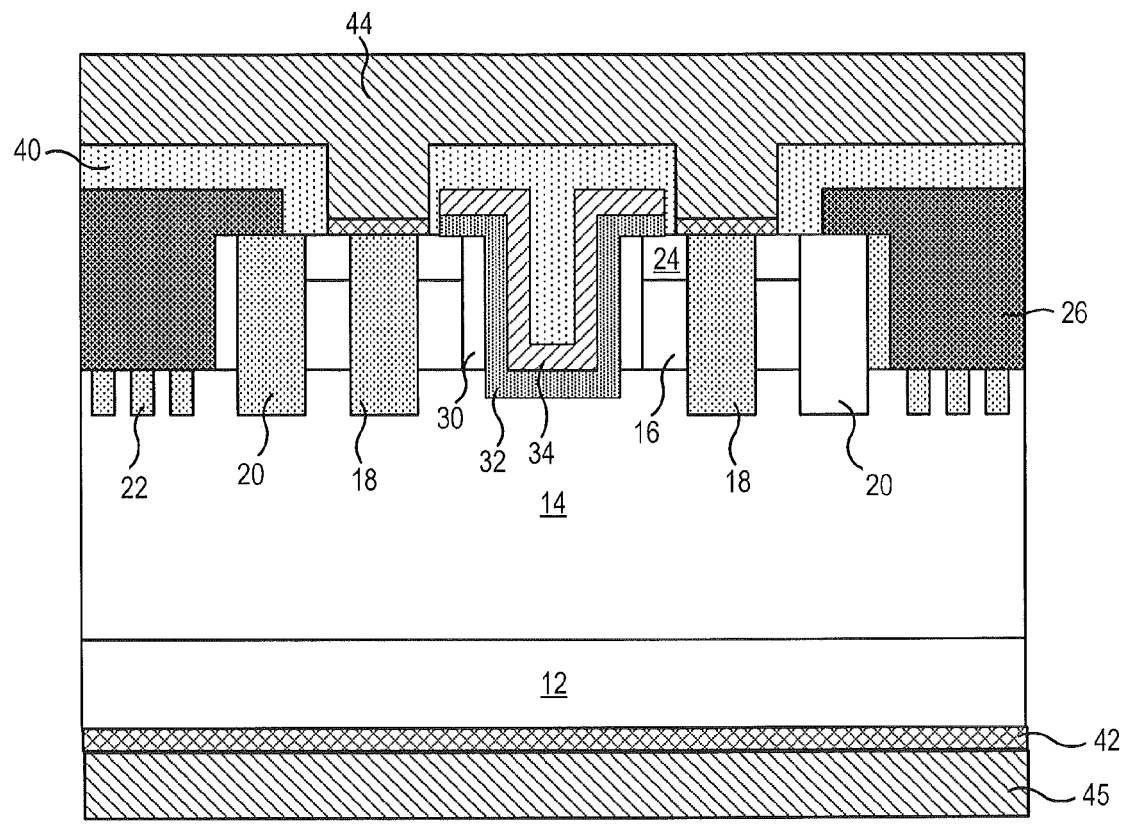

Referring to FIG. 3H, an interlayer dielectric layer 40 may be deposited and patterned to expose portions of the body contact regions 18 and the source regions 24. Ni may be as the n-type source ohmic contact 43 and the drain ohmic contact 42. The contacts may be sintered in a Rapid Thermal Annealer (RTA). Referring to FIG. 3I, thick Ti/Ni/Au or Ti/Pt/Au layers may be deposited as a source pad 44 and a drain pad 45.

FIGS. 4A to 4D are cross sectional views illustrating the fabrication of a power MOSFET device according to further embodiments.

Figure 4A:
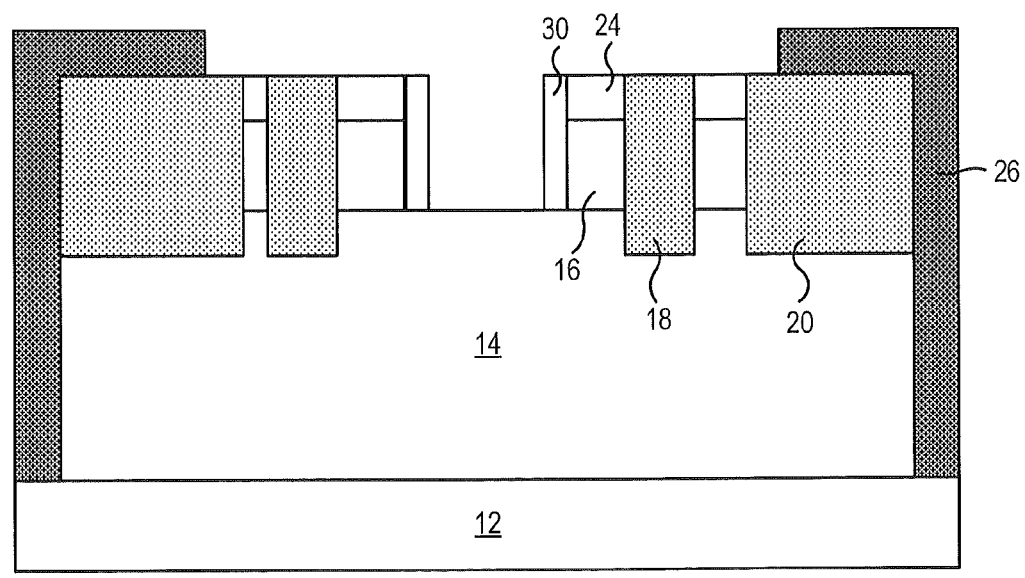
FIGS. 4A to 4D are cross sectional views illustrating the fabrication of a power MOSFET device according to further embodiments.

Referring to FIG. 4A, after formation of the body contact regions 18 and the channel layers 30, peripheral portions of the structure may be etched to expose portions of the substrate 12. A field oxide layer 26 may be formed in the peripheral regions of the structure and may extend up onto the unetched termination edge regions 20 that are implanted together with the body contact regions 18.

Figure 4B:
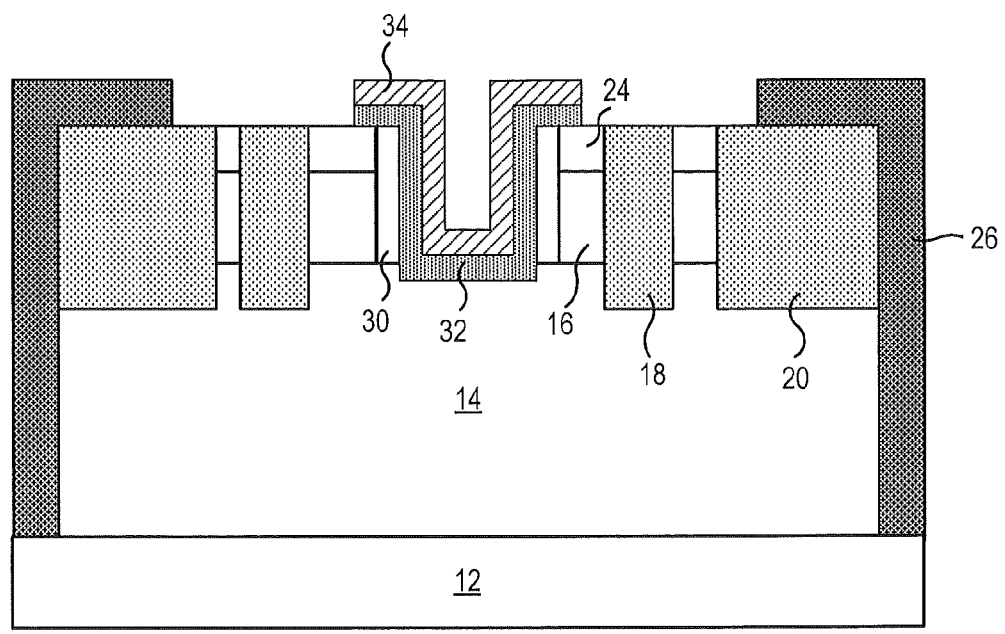
Figure 4C:
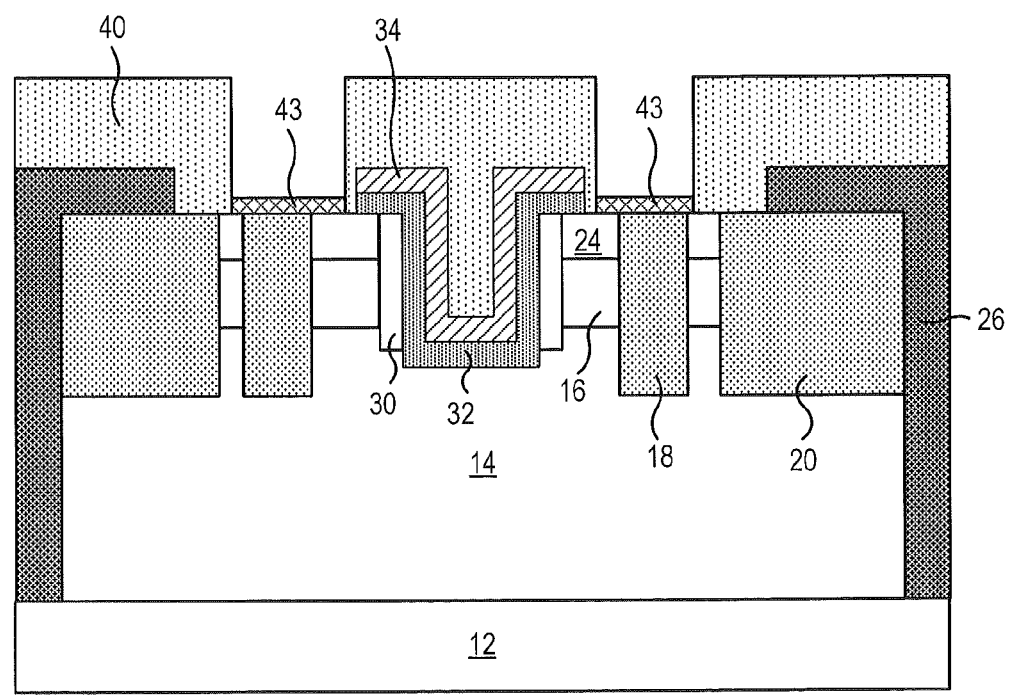
Figure 4D:
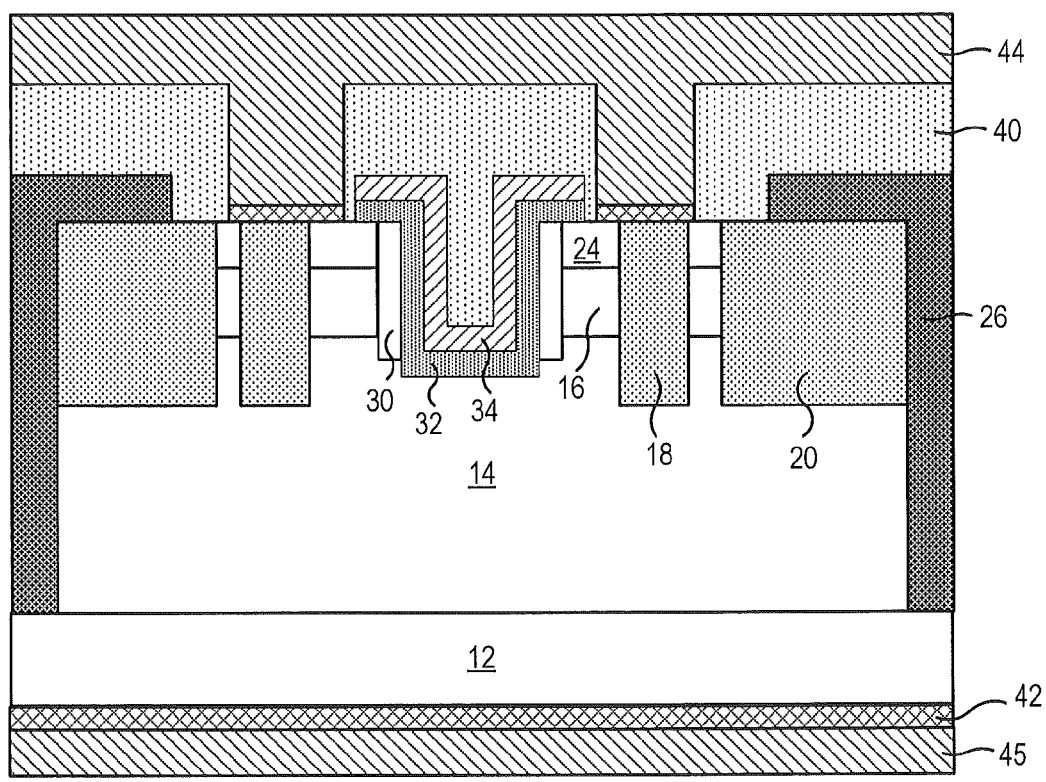

Referring to FIGS. 4B to 4D, a gate insulator 32 and a gate 34 may be formed on the structure, an interlayer insulating layer 40 may be formed on the gate structure, and source and drain contacts 43/44 and 42/45 may be formed as described above.

Figure 5:
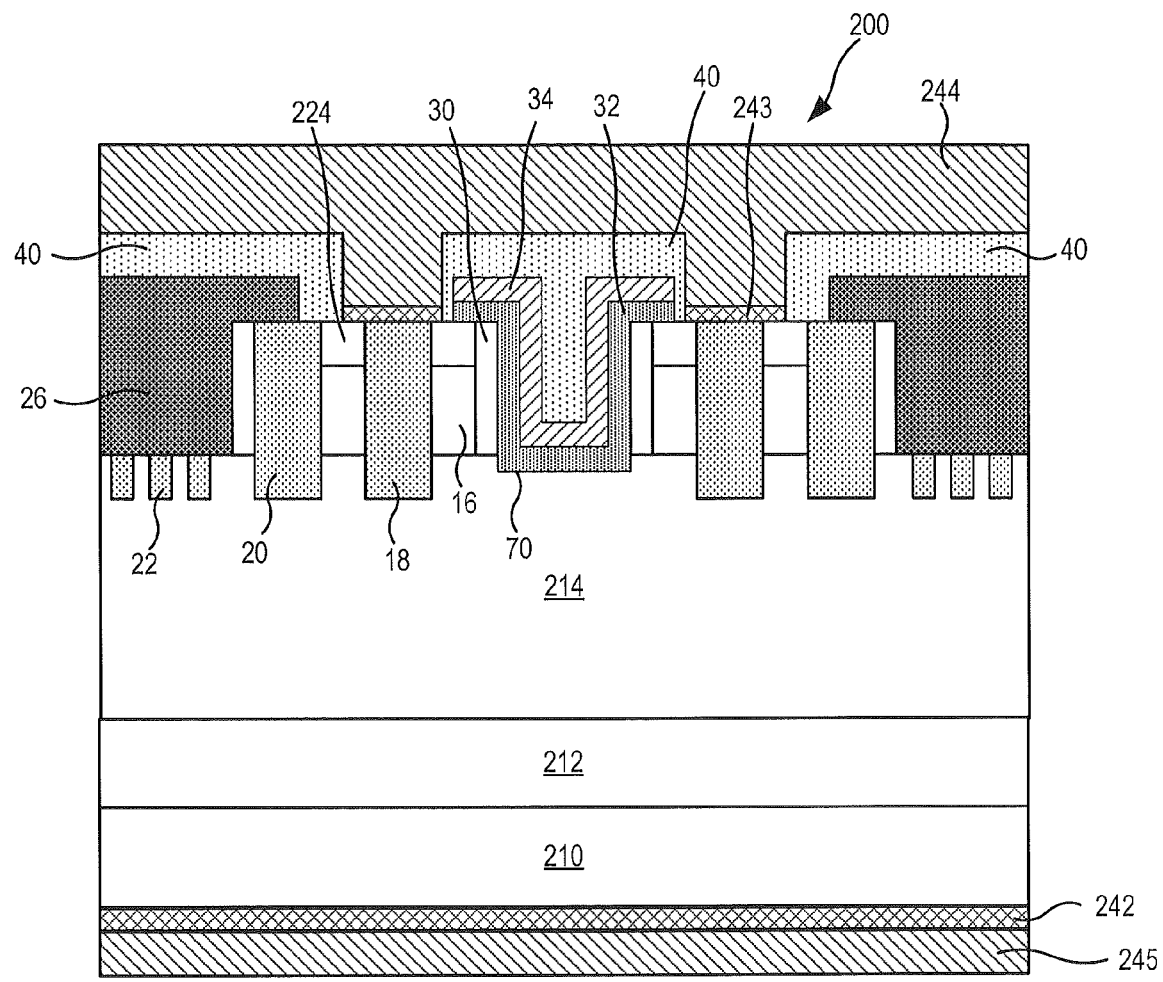
FIG. 5 is a cross sectional illustration of a cell of an insulated gate bipolar transistor according to some embodiments.

An insulated gate bipolar transistor (IGBT) device 200 according to some embodiments is illustrated in FIG. 5. As shown therein, the IGBT device includes an n− drift epitaxial layer 214 on a p-type epitaxial layer 212. The p-type epitaxial layer 212 is formed on a heavily doped p-type, 2° to 8° off-axis 4H—SiC substrate or layer 210. The n− drift layer 214 may have a thickness of about 100 μm to about 200 μm, and may be doped with n-type dopants at a doping concentration of about $5 \times 10^{13}$ $cm^{-3}$ to about $5 \times 10^{15}$ $cm^{-3}$ for a blocking capability of about 10 kV or above.

The device 200 includes collector ohmic contacts 243/244 on a collector region 224 and an emitter contact 242/245 on the substrate 210. The remainder of the structure is similar to the structure shown in FIG. 1.

It will be appreciated that although some embodiments of the invention have been described in connection with silicon carbide IGBT and MOSFET devices having n-type drift layers, the present invention is not limited thereto, and may be embodied in devices having p-type substrates and/or drift layers. Furthermore, the invention may be used in many different types of devices, including but not limited to insulated gate bipolar transistors (IGBTs), MOS controlled thyristors (MCTs), insulated gate commutated thyristors (IGCTs), junction field effect transistors (JFETs), high electron mobility transistors (HEMTs), etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
   a drift layer having a first conductivity type;
   a body layer on the drift layer, the body layer having a second conductivity type opposite the first conductivity type;
   a source region on the body layer, the source region having the first conductivity type;
   a trench extending through the source region and the body layer and into the drift layer, the trench having an inner sidewall;
   a channel layer on the inner sidewall of the trench and on the drift layer, the channel layer having the second conductivity type and having an inner sidewall opposite the inner sidewall of the trench;
   a gate insulator on the inner sidewall of the channel layer and on the drift layer without the channel layer being disposed between the gate insulator and the drift layer;
   a gate contact on the gate insulator;
   a body contact region having the second conductivity type, wherein the body contact region is adjacent to and spaced apart from the trench and extends through the source region and the body layer and into the drift layer; and
   a termination region having the second conductivity type and extending through the source region and the body layer and into the drift layer, wherein the body contact region is between the termination region and the trench.

2. The transistor of claim 1, wherein the channel layer has an upper surface, wherein the gate insulator is on the upper surface of the channel layer and the gate contact extends onto the gate insulator above the upper surface of the channel layer.

3. The transistor of claim 2, wherein the gate insulator extends onto the source region adjacent the channel layer, and the gate contact extends onto the gate insulator above the source region.

4. The transistor of claim 1, wherein the trench extends about 0.1 micron to about 1 micron into the drift layer.

5. The transistor of claim 1, wherein the channel layer has a thickness of about 50 to 200 nanometers.

6. The transistor of claim 1, wherein the gate insulator extends into the trench adjacent a sidewall of the drift layer exposed by the trench beneath the channel layer.

7. A transistor device, comprising:
   a drift layer;
   a body region having a first surface
   source and drain regions on opposite sides of the body region;
   a channel layer on the first surface of the body region and on the drift, layer, the channel layer extending onto the source and drain regions;
   a gate insulator on the channel layer and on the drift layer without the channel layer being disposed between the gate insulator and the drift layer;

wherein the body region and the channel region have a first conductivity type and the source and drain regions have a second conductivity type that is opposite the first conductivity type;

the transistor device further comprising a body contact region having the second conductivity type, wherein the body contact region is adjacent to and spaced apart from the trench and extends through the source region and the body layer and into the drill layer; and a termination region haying the second conductivity type and extending through the source region and the body layer and into the drift layer, wherein the body contact region is between the termination region and the trench.

8. The transistor device of claim 7, further comprising:

a gate contact on the gate insulator, wherein the gate contact is spaced apart from the source and drain regions by the gate insulator.

9. The transistor device of claim 1, wherein the body layer and the source region form a mesa on the drift layer, the transistor device further comprising a floating guard ring edge termination on the drift layer outside the mesa.

\* \* \* \* \*

UNITED STATES PATENT AND TRADEMARK OFFICE
CERTIFICATE OF CORRECTION

PATENT NO. : 9,012,984 B2  
APPLICATION NO. : 13/798919  
DATED : April 21, 2015  
INVENTOR(S) : Cheng et al.

It is certified that error appears in the above-identified patent and that said Letters Patent is hereby corrected as shown below:

In the Claims:
Column 10, Claim 1, Line 33: Please correct "haying," to read -- having, --

Column 10, Claim 7, Line 59: Please correct "surface" to read -- surface; --

Signed and Sealed this  
Seventeenth Day of November, 2015

Michelle K. Lee  
*Director of the United States Patent and Trademark Office*